United States Patent [19]
Tielert et al.

[11] Patent Number: 5,629,629
[45] Date of Patent: May 13, 1997

[54] CIRCUIT ARRANGEMENT FOR DETERMINING DIFFERENCES IN CAPACITANCE

[75] Inventors: Reinhard Tielert, Winnweiler; Andreas Hildebrandt, Speyer, both of Germany

[73] Assignee: Siemens Aktiengesellschaft, Munich, Germany

[21] Appl. No.: 627,407

[22] Filed: Apr. 4, 1996

[30] Foreign Application Priority Data

Apr. 6, 1995 [DE] Germany ............ 19 513 022.7

[51] Int. Cl.$^6$ ............................................. G01R 27/26
[52] U.S. Cl. ............................ 324/679; 324/665; 324/678; 73/514.32; 73/718
[58] Field of Search ............................. 324/665, 672, 324/678, 607, 663, 679; 73/503, 514.32, 718, 862.52, 304 C; 327/63, 65; 340/870.37

[56] References Cited

U.S. PATENT DOCUMENTS

| | | | |
|---|---|---|---|
| 4,392,378 | 7/1983 | Pitches et al. | 73/304 C |
| 4,736,629 | 4/1988 | Cole | 324/678 X |
| 5,028,876 | 7/1991 | Cadwell | 324/678 |
| 5,122,755 | 6/1992 | Nootbaar et al. | 324/678 |
| 5,194,819 | 3/1993 | Briefer | 324/678 X |
| 5,299,460 | 4/1994 | Schultz et al. | 324/678 X |
| 5,428,352 | 6/1995 | Bennett | 324/679 X |

FOREIGN PATENT DOCUMENTS

| | | |
|---|---|---|
| 0503272A1 | 9/1992 | European Pat. Off. . |
| 3623136C2 | 1/1987 | Germany . |
| 4103433A1 | 8/1991 | Germany . |
| 0890271 | 12/1981 | U.S.S.R. .............. 324/679 |
| 2087084 | 5/1982 | United Kingdom ... 324/679 |

*Primary Examiner*—Kenneth A. Wieder
*Assistant Examiner*—Diep Do
*Attorney, Agent, or Firm*—Hill, Steadman & Simpson

[57] ABSTRACT

In a circuit arrangement for determining differences in capacitance, two capacitors (1,2) are alternately connected to an integrator with differential amplifier (3) whose input current is positive (+I) when the first capacitor (1) is integrated or negative (−I) when the second capacitor (2) is integrated, whereby the switches (5,6,7) are synchronously switched. The differential amplifier keeps the voltages at the two capacitors the same. A clocked control device (4) controls the synchronous switching and separately measures and adds the respective charging and discharging times and, as warranted, measures and adds the output voltage of the integrator and controls the last charging cycle such that the voltage at the capacitors is subsequently equal to the initial voltage. The relative or absolute differences in capacitance are calculated from the identified sums and can be digitally output.

11 Claims, 2 Drawing Sheets

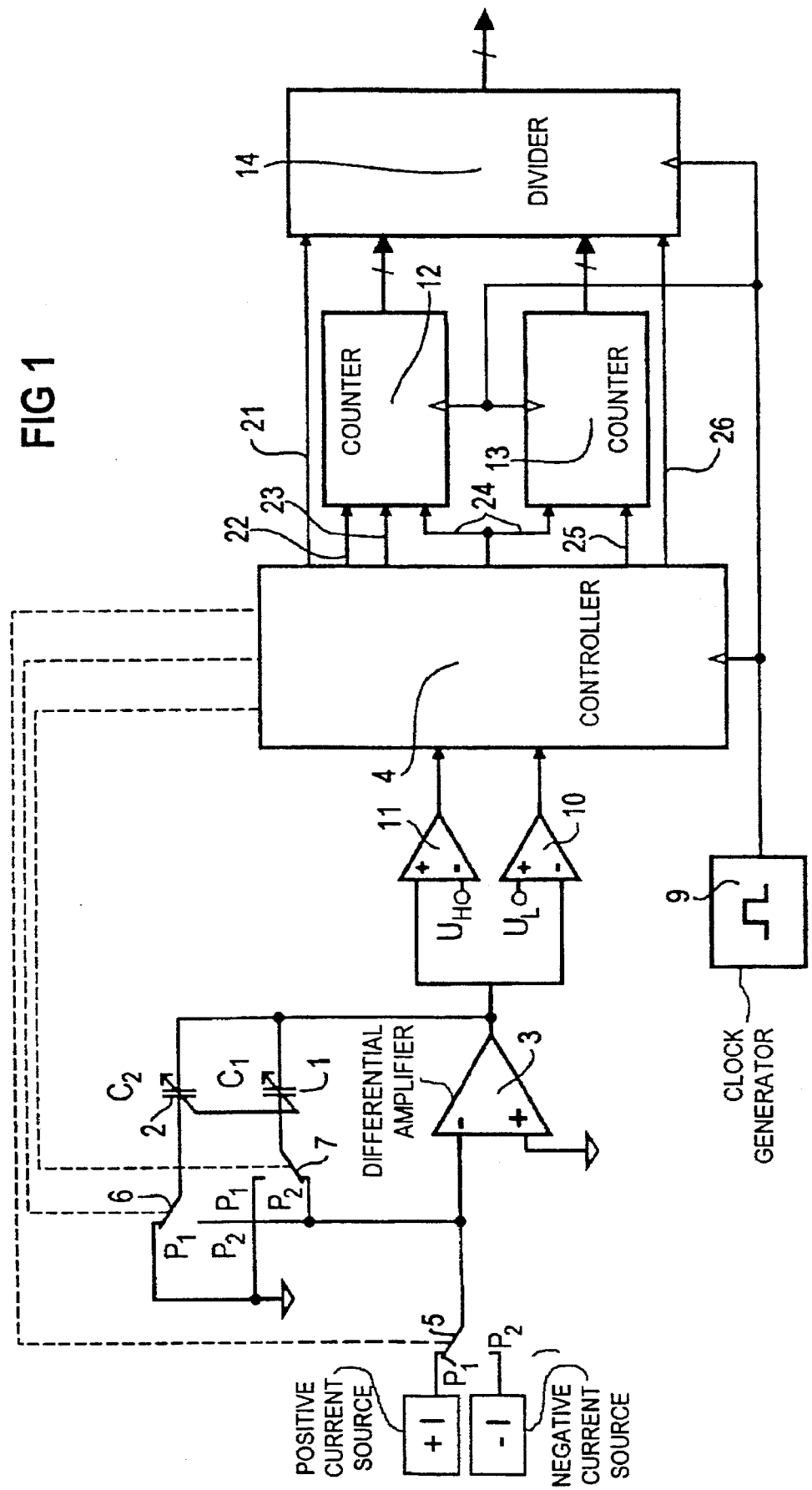

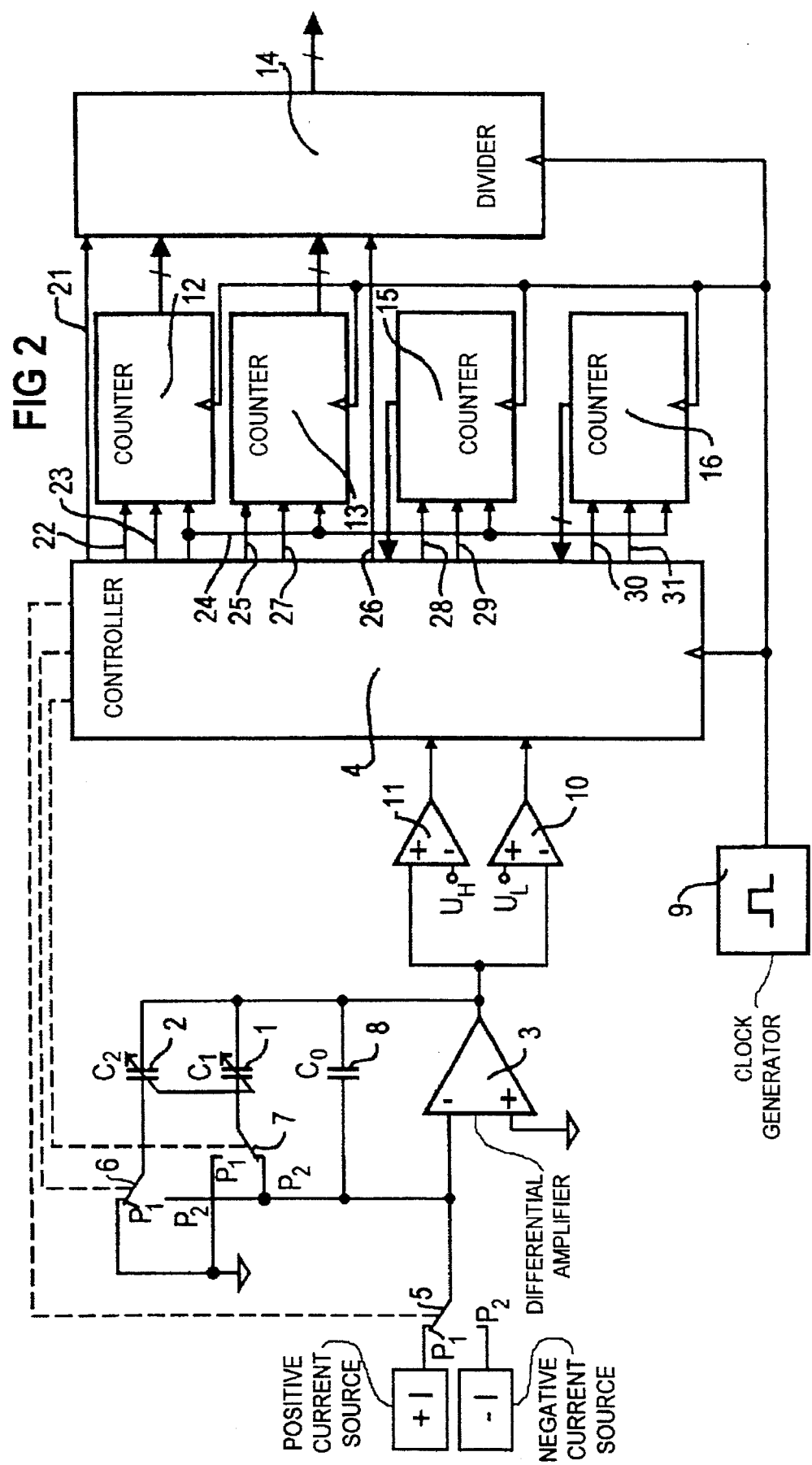

CIRCUIT ARRANGEMENT FOR DETERMINING DIFFERENCES IN CAPACITANCE

BACKGROUND OF THE INVENTION

The present invention is directed to an apparatus and method for the digital measurement of a difference in capacitance of two capacitors.

Such an apparatus or circuit arrangement can, for example, provide digital evaluation of differential capacitors. Differential capacitors are often utilized in sensor technology for measuring pressure, acceleration, humidity, slope, etc. Various devices have already been proposed for measuring differences in capacitance (see, for example, German reference DE 36 23 136, U.S. Pat. No. 4,392,378, German reference DE 41 03 433, European reference EP 0 503 272). In the known methods, the measured quantity (difference in capacitance) is represented either by the value of a voltage (or, respectively, of a current) or by the pulse-duty ratio of a PWM signal. An additional A/D conversion must occur in any case for a digital processing.

SUMMARY OF THE INVENTION

It is an object of the present invention to provide an apparatus that allows the difference in capacitance of two capacitors to be measured and digitally output without, however, requiring an analog-to-digital (A/D) converter in addition to the measuring circuit. The apparatus can be realized with commercially obtainable component parts should be possible in an optimally simple way, and an integration can unproblematically ensue as warranted. In a further development, the apparatus allows existing parasitic capacitances to be eliminated from the calculation of the measured result.

In general terms the present invention is a circuit arrangement for determining the difference between the capacitance of a first capacitor and the capacitance of a second capacitor. A differential amplifier has an inverting and a non-inverting input and has an output. A positive current source delivers a current with a constant current magnitude and a first flow direction. A negative current source delivers a current with constant current magnitude and the opposite flow direction. A ground terminal, a control means, a first switch means and a second switch means are provided. This first switch means has two switch positions wherein the positive current source or the negative current source is respectively connected to the inverting input of the differential amplifier. The non-inverting input of the differential amplifier is connected to the ground terminal. The second switch means is configured such that two different switch positions wherein respectively one terminal of one of these capacitors is connected to one of the inputs of the differential amplifier. A terminal of the other of these capacitors is connected to the respectively other input of the differential amplifier can be set therewith. The other terminals of these capacitors are connected to the output of this differential amplifier and to an input of the control means. Means are provided for this control means with which the first and second switch means can be synchronously switched, with which the time between two such switching events and the voltage at the capacitors can be measured, with which times can be added and with which the values required for defining the difference in capacitance can be determined.

In an advantageous development of the present invention the first switch means is a first switch and the second switch means is a second switch and a third switch. These switches can be respectively alternatively brought into a first switch position and into a second switch position wherein a fixed terminal of the appertaining switch is respectively connected to one of two alternating terminals. The fixed terminal of the first switch is connected to the inverting input of the differential amplifier and one of the alternating terminals of the first switch is connected to the positive current source. The other of the alternating terminals of the first switch is connected to the negative current source. In one case the fixed terminal of the second switch is connected to a terminal of one of the capacitors, and the fixed terminal of the third switch is connected to a terminal of the other capacitors. Respectively one of the alternating terminals of the second and of the third switch is connected to the one input of the differential amplifier, and the respectively other of the alternating terminals is connected to the respectively other input of the differential amplifier. In another case the fixed terminal of the second switch is connected to an input of the differential amplifier and the fixed terminal of the third switch is connected to the other input of the differential amplifier. Respectively one of the alternating terminals of the second switch and of the third switch is connected to a terminal of one of the capacitors and the respectively other of the alternating terminals is connected to a terminal of the other capacitor. Means are provided for the control means with which these switches, as provided for this second switch device, can be synchronously switched. Furthermore, the switches can be individually switched. Also, the positive and the negative current sources can deliver current with an identical current magnitude. The first switch means can be switched independently of the second switch means.

In a further development of the present invention the second switch means enables a switch position wherein the terminals of the capacitors connected to an input of the differential amplifier are both connected to the ground terminal. The second switch means can be switched, synchronously with the first switch means, between this switch position and each of the two switch positions wherein the terminals of the capacitors connected to an input of the differential amplifier are connected to different inputs of the differential amplifier. The control means has means with which changes in the voltage at the capacitors respectively ensuing at least for one of these switch positions can be added and this sum can be stored. The control means has means with which switching can be carried out between switch positions as soon as the amount of the sum of the changes in the voltage at the capacitors respectively occurring in a specific constellation of the switch positions of the switch means reaches the amount of a value stored by the control means.

The present invention is also a method for determining the quotient of the capacitances of two capacitors or the quotient of the difference and the sum of the capacitances of two capacitors.

In a step a) the quotient of the current magnitudes of the current delivered by the positive current source and of the current delivered by the negative current source is permanently set. The first switch means is brought into a first switch position, and the second switch means is set such that the one capacitor is connected to the one input of the differential amplifier and the other capacitor is connected to the other input of the differential amplifier.

In a step b) the capacitor connected to the first switch means is charged or discharged during a predetermined time or during a time identified by the control means from previous method steps, whereas the differential amplifier charges the other capacitor to the same voltage.

In a step c) the first and the second switch means are synchronously switched, so that the terminals of the capacitors connected to an input of the differential amplifier are connected to the respectively other input of the differential amplifier.

In a step d) the step b) is implemented.

In a step e) the steps c) and d) are repeatedly implemented in succession, whereby the times during which step b) or step d) has been implemented are separately added for each of the two switch positions between which switching was carried out in step c), and step d) is implemented so often and until the voltage at the capacitors subsequently coincides with the voltage at the capacitors at the start to at least the extent as required for the given measuring precision.

In a step f) the quotient of the capacitances or the quotient of the difference and the sum of the capacitances of the capacitors is calculated from the known or separately identified quotients of the current intensities and the sums of the times added separately for the switch positions.

In general terms the present invention is also a method for determining the difference of the capacitances of two capacitors or the quotient of the difference and the sum of the capacitances of two capacitors.

In a step a) the quotient of the current intensities of the current delivered by the positive current source and the current delivered by the negative current source is permanently set. The first switch means is brought into a first switch position and the second switch means is set into one of two specific switch positions A or B wherein either the one capacitor is connected to the one input of the differential amplifier and the other capacitor is connected to the other input of the differential amplifier or the terminals of the capacitors connected to an input of the differential amplifier are both connected to the ground terminal.

In a step b) a further capacitor (circuit component with a defined capacitance or unknown parasitic capacitance) that is present between the inverting input of the differential amplifier and the output of the differential amplifier parallel to the differential amplifier is charged or discharged during a predetermined time or during a time identified by the control means from previous method steps, whereas the differential amplifier charges the other capacitor or capacitors to the same voltage.

In a step c) the first and the second switch means are synchronously switched, so that the capacitors proceed from the set, specific switch position into the other specific switch position.

In a step d) the step b) is implemented.

In a step e) the steps c) and d) are repeatedly implemented in succession, whereby the times during which step b) or step d) has been implemented are separately added for each of the two specific switch positions and the changes in the voltage at the capacitors respectively occurring during these times are separately added at least for one of these specific switch positions. The step d) is implemented as often and until the voltage at the capacitors subsequently coincides with the voltage at the capacitors at the start at least to the extent required for the given measuring precision. The sum of the changes in the voltage at the capacitors that occurred in these specific switch positions is stored by the control means.

In a step f) the second switch means is set into one of the two specific switch positions B or C, whereby, in switch position C, the one capacitor is connected to the one input of the differential amplifier and the other capacitor is connected to the other input of the differential amplifier and the terminals are thereby transposed compared to the specific switch position A.

In a step g) the step b) is implemented.

In a step h) the step c) is implemented, whereby switching is carried out between the specific switch positions B and C.

In a step i) the step b) is implemented.

In a step j) the steps h) and i) are repeatedly implemented in succession and the times during which step g) or step i) has been implemented are separately added for these two specific switch positions. The changes in the voltage at the capacitors respectively ensuing during these times are separately added at least for one of these specific switch positions and either the sum of the changes in the voltage at the capacitors that occurred in this specific switch position is likewise stored by the control means. Alternatively, the step i) is implemented in this specific switch position as often and respectively until the amount of this sum reaches the amount of the value stored by the control means in step e), and the step i) is implemented overall as often and respectively until the voltage at the capacitors subsequently coincides with the voltage at the capacitors at the start at least to an extent required for the given measuring precision.

In a step k) the quotient of the difference and the sum of the capacitances of the capacitors is calculated from the known or separately identified quotients of the current intensities. The sums of the times separately added for the switch positions and the quotient of the sums of the changes in the voltage respectively acquired in steps e) and j) or the difference in the capacitances of the capacitors is determined from these values and the known or separately identified value of the capacitance of the further capacitor (8).

In an advantageous development of each of the above-described methods, the quotient of the current intensities of the current delivered by the positive current source and of the current delivered by the negative current source is determined.

In a step a) the first switch means is brought into a first switch position and the second switch means is set such that at least one capacitor is connected to the first switch means.

In a step b) this capacitor is charged or discharged during a predetermined time or during a time identified by the control means from previous method steps.

In a step c) only the first switch means is switched over.

In a step d) the step b) is implemented.

In a step e) the steps c) and d) are repeatedly implemented in succession. The times during which this step b) or d) has been implemented are added separately for each of the two switch positions of the first switch means and the step d) is implemented as often and respectively until the voltage at the capacitor subsequently coincides with the voltage at the capacitor at the start at least to the extent required for the given measuring precision.

In a step f) the quotient of the current intensities of the current delivered by the positive current source and the current delivered by the negative current source is determined as quotient of the sum of the times separately added for the switch position wherein the capacitor is connected to the negative current source and the sum of the times separately added for the switch position wherein the capacitor is connected to the positive voltage source.

In the inventive circuit arrangement, a positive current is integrated with the one capacitor and a negative current is integrated with the other capacitor. The voltage of the capacitor not used for the integration is followed-up to the voltage of the capacitor used for the integration. An executive sequences measures the time durations of the individual integrations, calculates and digitally outputs a value therefrom and also controls the integration cycles such that the voltage on the capacitors remains within a predetermined range.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIG. 1 is a block diagram of the present invention; and

FIG. 2 is a block diagram of a further development of the present invention.

DESCRIPTION OF THE PREFERRED EMBODIMENTS

The circuit arrangement illustrated in FIG. 1 shows the two capacitors 1,2 for which, for example, the quotient of the capacitances or the difference of the capacitances referred to the sum of the capacitances (relative difference in capacitance) is to be determined. An integrator can be alternately connected to these capacitors 1,2, this integrator being supplied from a current source with a positive output current (positive current source +I) in alternation with a current source with a negative output current (negative current source −I). A first circuit means 5, which is formed by a first switch 5 in this exemplary embodiment, enables one or the other current source, +I, −I, to be connected in alternation. The current sources, +I, −I, each respectively supply a current having a constant current magnitude that is conducted to the inverting input of a differential amplifier 3. The non-inverting input of this differential amplifier 3 is connected to a ground terminal. Respectively one terminal of the two capacitors 1,2 to be measured is connected to the output of this differential amplifier 3. A second circuit device is present, this being formed by a second switch 6 and a third switch 7 in the exemplary embodiment shown in FIG. 1. This second circuit device 6,7 is configured such that it enables respectively one terminal of the capacitors 1,2 to be connected either to the ground terminal (reference potential at the non-inverting input of the differential amplifier 3) or to the inverting input of the differential amplifier 3 (virtual ground). What this circuit arrangement effects is that the voltages at the two capacitors coincide at all times.

The synchronous switching of the three switches 5,6,7 is effected by an executive sequencer that has a control means 4 (controller) following the output of the differential amplifier 3. This control means 4 also has a voltmeter that measures the voltages at the capacitors. The control means 4 also has a timekeeper and means for adding up time durations that have been identified. The control means 4 is preferably connected to a clock generator 9. The times can then be digitally added and processed in this form for further calculations and the output of the result. In a preferred development of the inventive circuit arrangement, this control means 4 immediately supplies the computationally identified result for the value of the difference in capacitance. It is advantageous for further developments of this circuit arrangement that the first switch 5 be actuated independently of the other switches or that the first switch 5 be respectively synchronously switched with only one of the other two switches. Instead of a synchronous control of separate switches, a multiple switch realized, for example, as an electronic circuit can be present, this being designed such that, during switching, it simultaneously appropriately modifies all connections to be switched. In such a realization of the two circuit devices, the first switch device integrated in the common switch can be differentiated from the second circuit device. The separate designation of these circuit devices and the description of the specific embodiment of FIG. 1 therefore do not represent any limitation of the possible, further embodiments of this circuit arrangement. The arrangement shown in FIG. 1 is advantageous because of the especially simple design.

For explaining the functioning of this arrangement, the measuring method shall be described first. At the beginning of a measurement, the capacitors are preferably entirely or at least substantially discharged. The first switch means (first switch 5) is switched into a first switch position $P_1$ in which the positive current source +I is connected to the inverting input of the differential amplifier 3 in the example indicated in FIG. 1. In the initial position shown in FIG. 1, the first capacitor 1 is connected to the inverting input of the differential amplifier 3 by the second switch means, whereas the second capacitor 2 is connected to the ground terminal. The current supplied by the positive current source +1 is therefore integrated first in that the first capacitor is charged to a specific voltage. The circuit arrangement changes the second capacitor 2 to the same voltage because of the differential amplifier. The charging of the first capacitor 1 ensues, for example, during a predetermined time span. This time span is monitored by the control means 4 in which, for example, this time is permanently prescribed or defined by a connected clock generator 9. Instead, a check can be carried out via a voltmeter to determine that the voltage at the capacitors only rises up to a defined value, and the integration of the current is then interrupted. After the expiration of this defined integration time, the first and the second switch means 5,6,7 are synchronously switched by the control means 4, so that the current from the other current source (the negative current source −I in this example) with opposite flow direction is integrated, and the capacitor previously connected to the ground terminal is connected to the inverting input of the differential amplifier 3, and the other capacitor is connected to the ground terminal. This second integration, wherein the current flows in the opposite direction, is implemented for a time corresponding to the time span prescribed in the control means 4 or corresponding to the clock rate or until the voltage at the capacitors falls below a specific value. For example, this value can be the reference potential established by the ground terminal. Subsequently, all switches are simultaneously brought into the initial position, so that a further integration cycle can occur, whereby the first capacitor is again charged first with the positive current and the second capacitor is then discharged with the negative current, whereby the differential amplifier respectively matches the voltage on the other capacitor. The control means 4 can, for example, thereby set the integration times such that the output voltage is again at the capacitors after every integration cycle. However, the voltage at the capacitors can also change after every integration cycle, whereby, however, at least the last integration duration is preferably set such for the evaluation of the measured results that the voltage originally adjacent at the capacitors is again reached at the end. The sums of the voltage changes in the charging or, respectively, discharging of the capacitors, namely, then fall out of the equations used for the calculation of the result value.

The evaluation of the measurement uses the equation CU=Q valid for capacitors, whereby the charge Q, because of the constant current, is equal to the product of current intensity and time. This equation is applied n times given n integration cycles. The calculation deriving therefrom leads to the following equations. Denoting therein are:

$I_+$, $I_-$ the amount of the current intensity of the current from the positive or, respectively, negative current source, $C_+$, $C_-$ the capacitance of the respective capacitor connected to the positive or, respectively, negative current source, $C_1$, $C_2$ the capacitance of the first or, respectively, second capacitor, $C_0$ the capacitance of a further capacitor, $t_+$, $t'_+$, $t''_+$ times during which charging is carried out from the positive current source +I, $t_-$, $t'_-$, $t''_-$ times during which discharging is carried out from the negative current source −I, $U_+$, $U'_+$, $U''_+$, $U_-$, $U'_-$, $U''_-$ voltage differences that are respectively produced at the capacitors during charging or, respectively, discharging.

In the following equations, the lower case letter, a subscript index of the summation sign, respectively denotes the running index with which the respective quantities belonging to an integration cycle are consecutively numbered. The plus sign, as an index, respectively identifies a time interval and a change in voltage that occurs therein during the connection to the positive current source +I, i.e. the first switch is in position $P_1$ in the exemplary embodiment of FIG. 1. The minus sign correspondingly denotes the time intervals or, respectively, voltage changes during connection to the negative current source −I, i.e. specifically the first switch 5 in the second switch position $P_2$. The calculation proceeds from the following equations:

$$I_+ \Sigma_f t_{+f} = C_+ \Sigma_f U_{+f}$$

$$I_- \Sigma_g t_{-g} = C_- \Sigma_g U_{-g}$$

In case the charging times and voltage changes are separately summed during the measurement, the difference or the quotient of the capacitances can already be determined from these equations given knowledge of the current intensities. If the measurement is set up such that $\Sigma_f U_{+f} = \Sigma_g U_{-g}$, then $$C_+ I_- \Sigma_g t_{-g} = C_- I_+ \Sigma_f t_{+f}$$

follows from the equations. In order to set the sum of the voltages changes in the integration and de-integration to be equal, it is merely required that a voltmeter be used to determine when the voltage at the capacitors reaches the initial value again. At this moment, the charging or discharging of the capacitors is interrupted, and the two sums of the positive and negative voltage changes are then identical. Instead of determining the quotients of the capacitances from the last-cited equation, the relative difference in capacitance can also be determined, i.e. the difference of the capacitances divided by the sum of the capacitances:

$(C_+ - C_-)/(C_+ + C_-)$ from the equation derived from the preceding equation $$(C_+ - C_-)(I_+ \Sigma_f t_{+f} + I_- \Sigma_g t_{-g}) = (C_+ + C_-)(I_+ \Sigma_f t_{+f} - I_- \Sigma_g t_{-g}).$$

It is especially advantageous when the two current sources +I, −I supply currents whose current intensities have the same amount $I_+$, $I_-$. This value then drops out of the last equation. If the capacitances of the capacitors are known, the difference of the capacitors can be determined relatively exactly with this method, even when the measuring precision of the individual capacitances is not adequate for the determination of this difference. This circuit arrangement and this measuring method, of course, can also be used to very exactly determine the capacitance of a capacitor from the difference between these unknown capacitance and the very exactly defined capacitance of a second capacitor used as reference quantity.

Influences of parasitic capacitances on the measured result can be eliminated by means of a development of the invention or, given employment of a third capacitor whose capacitance is very exactly defined, the difference in capacitance of the two capacitors to be measured can also be absolutely indicated with great precision. This development of the invention is explained with reference to FIG. 2, wherein a further capacitor 8 is connected in parallel to the differential amplifier 3 between the inverting input and the output thereof. This further capacitor 8 can either be a further component or a parasitic capacitance that is already present in the circuit arrangement, whereby FIG. 2 then represents only the equivalent circuit diagram of a real circuit according to FIG. 1. The measuring method is then configured, for example, in the following way.

In the first phase of the integration, the first switch 5 and the second switch 6 are, for example, in the first switch position $P_1$, as shown. The third switch 7 is in the other switch position $P_2$, so that the first capacitor 1 is connected to the positive current source +I and the second capacitor 2 lies at the ground terminal. The first capacitor 1 and the further capacitor 8 are then charged in common with the positive current, whereby the differential amplifier 3 charges the second capacitor 2 to the same voltage. Subsequently, only the first switch 5 is switched into the switch position $P_2$ and the third switch 7 is switched into the first switch position $P_1$ synchronously therewith. Only the further capacitor 8 is then discharged with the negative current from the current source −I, whereas the voltage at the two capacitors connected to the ground terminal is followed-up by the differential amplifier.

Renewed switching of the first switch 5 and of the third switch 7 initiates the next integration cycle. Instead of beginning in the constellation of the switch positions shown in FIG. 2, the second switch 6 and the third switch 7 can also at first both be in the switch position $P_1$, so that the first capacitor 1 and the second capacitor 2 are both connected to the ground terminal. Only the further capacitor 8 or, respectively, the parasitic capacitance is then first charged with the positive current from the current source +I. Subsequently, the further capacitor 8 and, for example, the first capacitor 1 are discharged in common after connection to the negative current source −I. One can also begin with the negative current from the negative current source −I. The procedure of alternate charging and discharging is preferably ended at a moment at which the voltage at the capacitors has again reached the initial value.

A second part of the method wherein, for example, one begins with the charging of only the further capacitor 8 then ensues. To that end, both the second switch 6 and the third switch 7 are brought into switch position $P_1$, i.e. both capacitors are applied to the ground terminal. The further capacitor 8 is then charged anew but, following the charging time, the first switch 5 and the second switch 6 are now switched into the other switch position $P_2$. Subsequently, thus, the second capacitor 2 and the further capacitor 8 are discharged in common. The first switch 5 and the second switch 6 are switched again and the further capacitor 8 or, respectively, the parasitic capacitance is again charged and are switched once again, whereby the first switch 5 and the second switch 6 are now respectively synchronously actuated. These integration cycles are ended when the voltage at the capacitors has again reached the initial value. It is especially advantageous for the evaluation of the measured result when, for the first part of the measuring method in which the first switch 5 is always synchronously switched with the one of the other two switches, the sum of all integration times of only the further capacitor (i.e., for example, all switches are in the switch position $P_1$) is of exactly the same size as the sum of the integration times of only the further capacitor in the second part of the method, when the first switch 5 is always synchronously switched with the other of the two switches. As explained in greater detail below on the basis of the equations utilized for the calculation, the evaluation is thereby considerably simplified.

A voltmeter must also be present in this embodiment of the invention, this communicating the voltage at the capacitors to the control means. When the capacitance of the further capacitor 8 is not known, the control means must have means that enable an addition of the voltage changes for a respective, defined constellation of the switch positions of all switches separately for each part of the method. It is important for the elimination of the influence of a parasitic capacitance when, thus, the capacitance of the further capacitor 8 is not known that the method be implemented such that the four sums of the amounts of the voltage changes are the same respectively separately added for each part of the method and for each constellation of the switch positions of the three switches. This addition of the amounts of the voltage changes can respectively ensue indirectly because the current intensities of the charging current and of the discharging current remain respectively constant. Each voltage change is therefore proportional to the respective duration of the charging or, respectively, discharging. It therefore suffices when, in the first part of the method, all time intervals during which both the first capacitor as well as the second capacitor are connected to the ground terminal are added and a check is carried out via the voltmeter at the end of this part to see that the voltage at the capacitors has again reached the initial value and when, in the second part, the integration cycles occur so often that the sum of the time intervals during which both the first capacitor as well as the second capacitor are connected to the ground terminal is equal to this sum from the first part. A check then merely has to be carried out with the voltmeter to see that the voltage at the capacitors at the end of the second part has also reached the initial value, so that the four sums of the amounts of the voltage changes added separately for the parts and switch positions are all equal. The summing of the respective time intervals can occur digitally using a clock generator connected to the control means by simply counting the clock signals.

For the first part of this method wherein the further capacitor 8 is respectively charged or, respectively, discharged individually or together with the first capacitor 1, the following basic equations are obtained wherein $C_0$ denotes the capacitance of the further capacitor and $C_1$ denotes the capacitance of the first capacitor 1 and $t_+$, $t_{31}$ denote the times during which the first switch 5 was respectively in the switch position $P_1$ or, respectively, $P_2$ and $U_+$ and $U_-$ denote the amounts of the appertaining changes of the voltage at the capacitors:

$$I_+\Sigma_f t_{+f} = C_0 \, \Sigma_f U_{+f}$$

$$I_-\Sigma_g t_{-g} = (C_0+C_1) \, \Sigma_g U_{-g}$$

For the second part of the method, the following basic equations correspondingly derive, whereby the variables are respectively provided with a prime in order to distinguish the times and voltage changes from the first part of the method:

$$I_+\Sigma_h t'_{+h} = C_0 \, \Sigma_h U'_{+h}$$

$$I_-\Sigma_i t'_{-i} = (C_0+C_2) \, \Sigma_i U'_{-i}$$

When, as described, the voltage at the capacitors achieves the initial value again after every part of the method, $\Sigma_f U_{+f} = \Sigma_g U_{-g}$ and $\Sigma_h U'_{+h} = \Sigma_i U'_{-i}$ consequently applies. Each pair of basic equations thus supplies one of the following equations:

$$C_0 \, I_-\Sigma_g t_{-g} = (C_0+C_1) \, I_+\Sigma_f t_{+f}$$

$$C_0 \, I_-\Sigma_i t'_{-i} = (C_0+C_2) \, I_+\Sigma_h t'_{+h}$$

Solving these equations for $C_1$ or, respectively, $C_2$ and subtraction yields $$(C_1 - C_2) \, I_+ \, \Sigma_f t_{+f} \Sigma_h t'_{+h} =$$

$$= C_0 \, I_- \, (\Sigma_g t_{-g} \Sigma_h t'_{+h} - \Sigma_f t_{+f} \Sigma_i t'_{-i}).$$

When, as already described above, the sums of the charging times of the further capacitor 8 alone are advantageously selected the same in both parts of the method, i.e. $\Sigma_f t_{+f} = \Sigma_h t'_{+h}$ applies then the above equation can be simplified to $$(C_1 - C_2) \, I_+\Sigma_f t_{+f} = C_0 \, I_- (\Sigma_g t_{-g} - \Sigma_i t'_{-i}). \quad \text{(Eq. 1)}$$

Given knowledge of the capacitance $C_0$ of the further capacitor 8, the difference of the capacitances $C_1$ of the first capacitor 1 and $C_2$ of the second capacitor 2 can be determined from this equation.

When, as in the case of the further capacitor 8, it is a matter of an unknown parasitic capacitance, the respectively first equation of the two pairs of basic equations is solved for $C_0$ in the calculation and the term that derives is introduced into the respectively second equation. $\Sigma_f U_{+f} = \Sigma_g U_{-g}$ and $\Sigma_h U'_{+h} = \Sigma_i U'_{-i}$ are thereby again taken into account. The equation $$(C_1 - C_2) \, (I_- \Sigma_g t_{-g} - I_+ \Sigma_h t'_{+h} \, \Sigma_f U_{+f}/\Sigma_h U_{+h}' +$$

$$+ I_- \Sigma_i t'_{-i} \, \Sigma_f U_{+f}/\Sigma_h U_{+h}' - I_+ \Sigma_f t_{+f}) =$$

$$= (C_1 + C_2) \, (I_- \Sigma_g t_{-g} - I_- \Sigma_i t'_{-i} \, \Sigma_f U_{+f}/\Sigma_h U_{+h}' +$$

$$+ I_+ \Sigma_h t'_{+h} \, \Sigma_f U_{+f}/\Sigma_h U_{+h}' - I_+ \Sigma_f t_{+f})$$

then follows from the two second equations of the pair of basic equations after the insertion. When, as set forth above, the sums of the amounts of the voltage changes in a respective direction are of the same size in each part of the method, i.e. when $\Sigma_f U_{+f} = \Sigma_h U'_{+h}$ applies, then, because of the first and third basic equation, $\Sigma_f t_{+f} = \Sigma_h t'_{+h}$ also applies. The above equation is then simplified to $$(C_1 - C_2) \, (I_- \Sigma_g t_{-g} + I_- \Sigma_i t'_{-i} - 2 I_+ \Sigma_f t_{+f}) = \quad \text{(Eq. 2)}$$

$$= (C_1 + C_2) \, (I_- \Sigma_g t_{-g} - I_- \Sigma_i t'_{-i}).$$

The quotient $(C_1-C_2)/(C_1+C_2)$ of the relative difference in capacitance can again be calculated from this equation.

The magnitudes of the current intensities $I_+/I_-$ must be known for the evaluation of the quotient of the amounts. Current sources that deliver currents having the same amount of the current intensity but opposite flow directions are advantageously used. When this is not possible or not desirable because of other circuit components, the magnitudes of the currents supplied by the positive current source +I and by the negative current source −I can also be set different. When the current intensities are not known, they can also be determined from the inventive circuit arrangement. A reference measurement wherein only a fixed capacitance of one or more of the existing capacitors is used is required for that propose. When only the capacitance $C_0$ of the further capacitor 8 is used, the second switch 6 and the third switch 7 are both brought into switch position $P_1$ or, given a different embodiment of the second switch means, the first capacitor 1 and the second capacitor 2 are correspondingly connected to the ground terminal. However, respectively one of the other capacitors or all capacitors in common can also be used for the reference measurement. The only thing that is necessary is that the set position of the second switch means 6,7 is not changed during this measurement. The connected capacitances are also not changed for the time duration of the measurement. The first switch means 5 switches back and forth between the positive and the negative current source. Charging for a specific time $t''_+$ and discharging for a specific time $t''_-$ are thus carried out in alternation. The times wherein the first switch means 5 is respectively in switch position $P_1$ and the times wherein the first switch means 5 is respectively in switch position $P_2$ are separately added $\Sigma_j t''_{+j}$ and $\Sigma_k t''_{-k}$ thus derive. The appertaining amounts of the change of the voltage at the charged or, respectively, discharged capacitor are likewise separately added to form the sums $\Sigma_j U''_{+j}$ and $\Sigma_k U''_{-k}$. The equations $$I_+ \Sigma_j t''_{+j} = C \Sigma_j U''_{+j}$$

and $$I_- \Sigma_k t''_{-k} = C \Sigma_k U''_{-k}$$

are then valid, whereby C is the capacitance of the appertaining capacitor. When the last charging or, respectively, discharging event lasts so long that $\Sigma_j U''_{+j} = \Sigma_k U''_{-k}$ applies, which can be determined in a simple way in that the voltage at the capacitor is equal to the initial voltage, then $$I_+ \Sigma_j t''_{+j} = I_- \Sigma_k t''_{-k}$$

follows immediately from the equations. The quotient $I_+/I_-$ can be immediately calculated from this equation. When, moreover, the sums of the charging or, respectively, discharging times are selected such that $\Sigma_j t_{+j} = \Sigma_j t''_{+j}$, then Equations 1 and 2 are simplified to $$(C_1 - C_2) \Sigma_k t''_{-k} = C_0 (\Sigma_g t_{-g} - \Sigma_i t'_{-i}) \quad \text{(Eq. 1')}$$

or, respectively, $$(C_1 - C_2)(\Sigma_g t_{-g} + \Sigma_i t_{-i}' - 2\Sigma_k t_{-k}'') = \quad \text{(Eq. 2')}$$

$$= (C_1 + C_2)(\Sigma_g t_{-g} - \Sigma_i t_{-i}').$$

Rationally, the integration takes on such a constellation that either charging and discharging are undertaken the same number of times or that charging and discharging are undertaken at most once more, i.e. switching back and forth is not undertaken without a charging or discharging event occurring therebetween. The number of summands belonging to a respective summation index in the pairs of basic equations that belong together are therefore either equal or differ by at most one. As derives from the indicated equations, it is required for the calculation that the control means 4, in which an arithmetic or evaluation means is to be potentially included, has means available with which the respectively measured time intervals can be added, and that the control means 4 also has means available that, when a specific voltage is reached at the capacitors, automatically synchronously switches the switch means or, respectively, interrupts the integration. Means must also be potentially present to added voltage changes that have been identified and to store the value of the sum, this then having to be subsequently compared to another value. What is always to be understood by summing, storing and comparison of voltages differences, especially in the interpretation of the claims, is that these voltage differences can be acquired in the form of time intervals proportional to the actual voltage differences and the indicated operations are implemented with these time intervals (integration times).

It is adequate in the elimination of a parasitic capacitance, for example, when the voltage changes when charging the parasitic capacitance with the one current source are respectively added. This value is stored by the control means 4. By comparing the voltage at the capacitor to the stored, initial value (for example, the voltage 0 given complete discharge), care is exercised to see that the capacitors are again at the initial value of the voltage after the first part of the method. All voltage changes that occur when charging only the parasitic capacitance are again correspondingly added in the second part of the method. The charging event is aborted at that moment at which this sum corresponds to the previously stored value. The discharging occurs again until the initial voltage is reached. What is achieved in this way is that the four sums of the amounts of the voltage changes appearing in the equations are of the same size. Only after every second switching event need the control means 4 therefore add a voltage difference to the value already stored, and the maximum value that is reached need be stored only once in the meantime and be compared to the intermediate sums of the voltage changes that are respectively reached. As described above, this can occur directly by counting off the time intervals of equal length determined by a clock generator. A comparison of pluralities determined in this way suffices for the executive sequencer of the method because the respective total amounts of the voltage changes, given analog evaluation of voltage changes that are actually measured and compared, also need be compared only to one another for equality and the magnitude in Volts would not need to be introduced into the further calculation.

When the two current intensities are the same in terms of magnitude or when, as in the case of a reference measurement for identifying $I_+/I_-$, the sums of the charging times are selected equal, as described above, the equations utilized for the calculation (see Equations 1' and 2') are simplified such that the relative difference in capacitance or, respectively, the difference in capacitance referred to the capacitance of the further capacitor can be simply calculated from the various sums of the charging and discharging times. Only these times therefore need be separately added and the respective sums be stored for the calculation. One can derive from the equations underlying the calculation in their farthest-reaching simplified form that can be applied to the disclosed, preferred embodiments of the measuring method that the result can be calculated in that only the time intervals are added, subtracted, multiplied and divided. These times are defined by a specific plurality of clock signals, whose spacing determines defined, shortest time intervals, and, consequently, calculation need only be carried out with pluralities.

The times of the charging and discharging events can all be selected to be the same or different values can be selected for the times for the charging and discharging events. When the times of the charging and discharging events are all the same, the last time period is different and is set such that the original voltage at the capacitor is again achieved. For simplifying the calculation, the last integration time must be respectively selected such that the initial voltage is again reached at the capacitors. When different integration times are fundamentally allowed, then the control means can be provided with means, for example, that respectively synchronously switch the switch means when a predetermined maximum or minimum voltage at the capacitors is reached. The times $t_+$, $t'_+$, $t_-$, $t'_-$, $t''_+$, and $t''_-$ can then differ from one another but, for example, be the same in each integration cycle. When the parts of the method begin in the same configuration of the switch positions, $t_+=t'_+$ will apply. The required equality of the sums of the amounts of the respective voltage changes in a direction then automatically derives from the equality of the pluralities of charging and discharging events. A digital summing of the integration times is thereby also possible when the control means is clocked.

A digital evaluation of the measurement can, for example, be undertaken with the circuit arrangements shown schematically at the right side in FIGS. 1 and 2. In this example, the integration cycles respectively ensue between a voltage $U_L$ and a voltage $U_H$. The control means 4 is connected to the output of the first differential amplifier 3 via two differential amplifiers 10,11. One of the inputs of these differential amplifiers respectively lies at the potential of one of these voltages $U_L$, $U_H$. Counters 12,13, a divider 14 and a clock generator 9 (trigger) are present. These counters 12,13 are switched on and off by the control means 4 and count the time units established by the clock generator. The counter 12 can be switched between addition and subtraction (up/down counter), the control line 23 being provided for this purpose.

The measurement is configured in such a way that these counters 12,13 first receive a reset command to a specific initial value ("ZERO") from the control means 4 via a corresponding control line 24 (RESET). The measurement of the capacitances begins after the control means 4 has switched the switch means 5,6,7 such that the capacitors are charged, for example, to the voltage $U_L$. The switch means are then switched for the first integration cycle. In the example of FIG. 1, for example, the first switch 5 is brought into the switch position $P_1$, the second switch 6 is brought into the switch position $P_1$ and the third switch 7 in brought into the switch position $P_2$. The counters 12, 13 are simultaneously started via the control lines 22,25 (ENABLE). As long as the voltage $U_H$ has not yet been reached at the capacitors, the counters add the time intervals established by the clock generator. When the voltage $U_H$ has been reached, the control means switches the switch means over, so that the three switches 5,6,7 in this example are switched into the respectively other switch position. At the same time, the first counter 12 is set to subtraction via the control line 23 (UP/DOWN), so that this counter now counts the time intervals negatively. The capacitors are discharged until the voltage $U_L$ is reached. This integration cycle is carried out, for example n times. Via the control lines 21,26 (ENABLE, LOAD) between the control means 4 and the divider 14, loading the values identified by the counters into the divider and implementing the division are then initiated. The result of this division immediately supplies the quotient of sum and differences of the capacitances.

The arrangement of FIG. 2 has two further counters 15,16 that are provided for determining whether the sums of all charging times in the various parts of the method are equal in size. In this arrangement, all counters 12,13,14,15 can be switched between addition and subtraction (UP/DOWN counters), the control lines 23,27,29,31 (UP/DOWN) being provided for this purpose. Here, too, the control line (RESET) communicates the reset command for the initial condition "ZERO" to the counters in order to be able to begin a new measurement. In the first part of the method, wherein, for example, the first switch 5 and the third switch 7 are respectively synchronously switched in each integration cycle, the third counter 15 is set via the corresponding control line 28 (ENABLE) to addition of the time intervals established by the clock generator 9. In the second part of the method, the first switch 5 and the second switch 6 are respectively synchronously switched. So that the sum of all charging times in this second part of the method, the quantities thereof being respectively provided with a prime in the above-recited calculations, is equal to the sum of the loading times in the first part of the method, this counter value is lowered at every time interval after the switching of, for example, the third counter 15 to subtraction via the control line 29 (UP/DOWN) until the initial value ("ZERO") is reached again. The plurality of all charging times in the second part of the method is thus equal to the plurality of all charging times in the first part of the method.

For example, the quotient of the difference and the sum of the capacitances to be measured can be determined according to the above-recited equation 2 with this way of implementing the method. Given, for example, identical amounts of the current intensities of the positive current source +I and the negative current source −I, the value of the expression $\Sigma_g t_{-g} - \Sigma_i t'_{-i}$ is determined with the first counter 12. The value of the expression $\Sigma_g t_{-g} - \Sigma_i t'_{-i} - 2\Sigma_f t_{+f}$ is determined with the second counter. To that end, all counters are first reset to the initial value ("ZERO") via the control line 24 (RESET). The measurement begins with all three switches 5,6,7 in the switch position $P_1$. At the same time, the second counter 13 is started via the control line 25 (ENABLE) and is set to subtraction via the control line 27 (UP/DOWN). The third counter 15 is started for addition via the control line 28. The charging event then ensues until the voltage at the capacitors has risen from $U_L$ to $U_H$. The control means 4 then switches the first switch 5 and the third switch 7 into the other switch position $P_2$. At the same time, the first counter 12 is started via the control line 22 (ENABLE), the second counter 13 is switched to addition via the control line 27 (UP/DOWN), and the third counter 15 is stopped. When, in the following discharge event, the voltage at the capacitors has changed from the value $U_H$ to the value $U_L$, the control means 4 switches the first switch 5 and the third switch 7 back into the first switch position $P_1$. The first counter 12 is stopped via the control line 22, the second counter 13 is switched to subtraction via the control line 27 (UP/DOWN), and the third counter 15 is started for addition via the control line 28 (ENABLE). This integration cycle is repeated as often as provided.

The second part of the method then begins. The control means 4 respectively places the switches 5,6,7 into the switch position $P_1$, stops the first counter 12 via the control line 22, starts the second counter 13 via the control line 25 and switches it to subtraction via the control line 27, and starts the third counter 15 via the control line 28 and simultaneously switches it to subtraction via the control line 29 (UP/DOWN). The charging events ensues proceeding from the voltage $U_L$ at the capacitors, until the voltage $U_H$ has been reached. The control means 4 then switches the first switch 5 and the second switch 6 into the respectively other switch position $P_2$. Simultaneously, the first counter 12 is started and set to subtraction via the control line 22 and the control line 23, the second counter 13 is set to addition via the control line 27, and the third counter 15 is stopped via the control line 28. When, during the following discharge event, the voltage at the capacitors has changed from the value $U_H$ to the value $U_L$, the control means 4 again switches the first switch 5 and the second switch 6 into the first switch position $P_1$. This integration cycle is repeated in the second part of the method until the third counter 15 has reached the initial value ("ZERO"). Loading the values determined by the first counter 12 and by the second counter 13 into the divider and implementing the division are then initiated via the control lines 21,26 (ENABLE,LOAD) between the control means 4 and the divider 14.

If the amounts of the current intensities of the positive and of the negative current source are not the same and their quotient must be determined, the otherwise superfluous fourth counter 16 can be used to also assure the same sum of the overall charging times for a third part of the method. To this end, the fourth counter 16 is started for addition together with the third counter 16. The control line 30 (ENABLE) is provided for this purpose. The fourth counter 16 remains deactivated in the second part of the method, wherein the third counter 15 subtracts. In a third part of the method, this counter 16 is set to subtraction via the appertaining control line 31 (UP/DOWN) and this third part of the method is continued until the fourth counter 16 indicates the initial value ("ZERO"). Given a reference measurement with $C=C_0$, both the second switch 6 and the third switch 7 are in the switch position $P_1$, whereas the first switch 5 is respectively switched between the switch positions. The first counter 12 and the second counter 13 are started such via the control lines 22,25 and switched such between addition and subtraction via the control lines 23,27 that, for example, the first counter determines the value $\Sigma_g t_{-g} - \Sigma_i t'_{-i}$ and the second counter 13 determines the value $\Sigma_g t_{-g} - \Sigma_i t'_{-i} - 2 \Sigma_k t''_{-k}$. Via the control lines 21 and 26, the control means 4 can then again instruct the divider to divide these values determined by the first counter 12 and the second counter 13. That is, initially both counters add. Subsequently, one of these counters subtract until the initial value is reached, and in a further subsequent segment of the method the other counter subtracts until the initial value is reached. The third counter 15 and the fourth counter 16 are started or stopped by the control means via the control lines 28,30 and switched from addition to subtraction via the control lines 29,31 such that, in a part of the method, the appertaining plurality of the time intervals are added by both counters or are respectively subtracted from the previously obtained value by a counter down to the initial value only in the charging events. By employing a third counter 15 that outputs a signal to the control means 4 when the initial value is reached again, $\Sigma_j t_{+j} = \Sigma_h t'_{+h}$ can thus be additionally achieved for two parts of the method. The equality of the sum of the time intervals for a third part as well can be achieved with the fourth counter, i.e. $\Sigma_j t_{+j} = \Sigma_j t''_{+j}$.

An expedient implementation of this method with reference measurements upon employment of all four counters is configured in detail as follows. First, all capacitors 1,2,8 are charged to the voltage $U_L$ via the current sources given suitable switch positions of the switches. The control means 4 then switches the first switch 5, the second switch 6 and the third switch 6 into the respectively first switch position $P_1$. The third counter 15 (via the control line 28) and the fourth counter 16 (via the control line 30) are started for addition simultaneously with the beginning of the integration. When the voltage $U_H$ at the capacitors is reached, the control means switches the first switch 5 and the third switch 7 into the other switch position $P_2$. Simultaneously, the first counter 12 (via the control line 22) and the second counter 13 (via the control line 25) are started for addition, and the third counter 15 and fourth counter 16 are stopped. The first integration cycle has ended when the initial voltage $U_L$ is again reached at the capacitors during the discharge event. The control means stops the first counter and the second counter via the control lines 22,25, switches the first switch 5 and the third switch 7 back into the switch position $P_1$, and again starts the third counter 15 and the fourth counter 16 for addition via the control lines 28,30.

After the provided plurality of integration cycles has been implemented, the control unit stops the counters, respectively switches the first switch 5, the second switch 6 and the third switch 7 into the switch position $P_1$ and starts the third counter 15 via the control line 28 and switches this counter to subtraction via the control line 29. The charging event then ensues anew until the voltage $U_H$ has been reached at the capacitors. The third counter 15 is then stopped via the control line 28. In this second part of the method (before the discharging of the capacitors), the first switch 5 and the second switch 6 are respectively switched into the other switch position P2, the first counter 12 is started for subtraction via the control lines 22 and 23, and the second counter 13 is started for addition via the control line 25. A new integration cycle can begin when the capacitors $U_L$ have again reached the value $U_L$ of the voltage during the discharge event. To that end, the control means again switches the first switch 5 and the second switch 6 into the switch position $P_1$ and again starts the third counter 15 for subtraction via the control line 28. The integration cycles in this second part of the method are implemented until the third counter 13 has again reached the initial value ("ZERO").

The third part of the method then begins, wherein the switches are at first all placed into switch position $P_1$ and the fourth counter 16 is started for subtraction via the control lines 30 and 31. After the capacitors have been charged to the voltage $U_H$, the control means switches the first switch into the switch position $P_2$, starts the second counter 13 for subtraction with twice the step width (i.e., the time intervals are doubly counted) via the control lines 25 and 27, and stops the fourth counter 16 via the control line 30. This integration cycle of the third part is ended when the voltage $U_L$ has again been reached at the capacitors. All switches are brought back into the switch position $P_1$, the second counter 13 is stopped, and the fourth counter 16 is started anew for subtraction via the control line 30. These integration cycles are repeated until the fourth counter 16 has again reached its initial value ("ZERO"). The values that are then stored in the first counter 12 and in the second counter 13 can then be in turn loaded into the divider 14 for the division, this being initiated via the control lines 21 and 26. Further evaluation ensues are set forth above.

By way of addition, let it also be noted that what is also to be understood by a synchronous switching of the switch means is the procedure wherein the current sources are first disconnected, i.e. the first switch 5 is connected neither to the one nor to the other terminal, the remaining switches are then switched, and only then is the connection to the current source produced. In this way, embodiments of the method wherein an adequately isochronic switch cannot ensue, for example due to a certain inertia of the switch means, are also included. The current source can then be disconnected first, all switches are then brought into the new constellation of the switch positions, and only then is the current source connected via the first switch. This procedure is also to be interpreted as a synchronous switching in the sense of the inventive method.

The present invention thus makes it possible to undertake digital measurements of differences in capacitance in a simple way without the disturbing influence of parasitic capacitances, whereby no high-precision elements are required for the fashioning of the circuit arrangement. The inventive method for eliminating parasitic capacitances using the disclosed circuit arrangement specifically enables the application of the invention for evaluating the measured results of micromechanical sensors.

The invention is not limited to the particular details of the method and apparatus depicted and other modifications and applications are contemplated. Certain other changes may be made in the above described method and apparatus without departing from the true spirit and scope of the invention herein involved. It is intended, therefore, that the subject matter in the above depiction shall be interpreted as illustrative and not in a limiting sense.

What is claimed is:

1. A circuit arrangement for determining a difference between a capacitance of a first capacitor and a capacitance of a second capacitor, comprising:

a differential amplifier having an inverting input and a non-inverting input and having an output, a positive current source that delivers a current with a constant current intensity and a first flow direction, a negative current source that delivers a current with constant current intensity and a second flow direction opposite to the first flow direction, a ground terminal, a control device, a first switch device and a second switch device;

said first switch device having first and second switch positions, in the first switch position the positive current source being connected to the inverting input of the differential amplifier and in the second switch position the negative current source being connected to the inverting input of the differential amplifier;

the non-inverting input of said differential amplifier connected to the ground terminal;

said second switch device configured such that in a first switch position a first terminal of the first capacitor is connected to the inverting input of the differential amplifier and a first terminal of the second capacitor is connected to the non-inverting input of the differential amplifier, and such that in a second switch position the first terminal of the first capacitor is connected to the non-inverting input of the differential amplifier and the first terminal of the second capacitor is connected to the inverting input of the differential amplifier;

second terminals of said first and second capacitors connected to the output of said differential amplifier and to an input of said control device;

said control device synchronously switching said first switch device and said second switch device;

device for determining a time between two switching events and the voltage occurring at the first and second capacitors, for adding said times and for determining values required for defining a difference in capacitance between the first and second capacitances.

2. The circuit arrangement according to claim 1, wherein the first switch device is a first switch and the second switch device is a second switch and a third switch, wherein said first, second and third switches are respectively alternatively brought into a first switch position and into a second switch position wherein a fixed terminal of the appertaining switch is respectively connected to one of two alternating terminals, wherein the fixed terminal of the first switch is connected to the inverting input of the differential amplifier and one of the alternating terminals of the first switch is connected to the positive current source and the other of the alternating terminals of the first switch is connected to the negative current source, wherein either a) the fixed terminal of the second switch is connected to a terminal of one of the first and second capacitors and the fixed terminal of the third switch is connected to a terminal of the other first and second capacitors and respectively one of the alternating terminals of the second switch and of the third switch is connected to one input of the differential amplifier and the respectively other of the alternating terminals is connected to the respectively other input of the differential amplifier or b) the fixed terminal of the second switch is connected to an input of the differential amplifier and the fixed terminal of the third switch is connected to the other input of the differential amplifier and respectively one of the alternating terminals of the second switch and of the third switch is connected to a terminal of one of the first and second capacitors and the respectively other of the alternating terminals is connected to a terminal of the other capacitor of the first and second capacitors, and wherein the control device has a further device with which first, second and third switches for this second switch device can be synchronously switched.

3. The circuit arrangement according to claim 2, wherein the switches are individually switched.

4. The circuit arrangement according to claim 1, wherein the positive current source and the negative current source deliver current with substantially identical current magnitudes.

5. The circuit arrangement according to claim 1, wherein the first switch device is switched independently of the second switch device.

6. The circuit arrangement according to claim 1, wherein the second switch device enables a first switch position wherein the first terminals of the first and second capacitors connected to an input of the differential amplifier are both connected to the ground terminal;

wherein the second switch device is switched, synchronously with the first switch device, between said first switch position and each of two switch positions wherein the first terminals of the capacitors, connected to an input of the differential amplifier, are connected to different inputs of the differential amplifier; and wherein the control device has a further device for adding changes in the voltage at the capacitors respectively ensuing at least for one of these switch positions and for storing a sum that is a result of the adding.

7. The circuit arrangement according to claim 6, wherein the control device has device for switching between switch positions as soon as a magnitude of the sum of changes in the voltage at the capacitors, respectively ensuing in a specific configuration of the switch positions of the first and second switch device reaches a level of a value stored by the control device.

8. A method for determining a quotient of capacitances of first and second capacitors or a quotient of a difference and a sum of the capacitances of the first and second capacitors, comprising the steps of:

providing a differential amplifier having an inverting input and a non-inverting input and having an output, a positive current source that delivers a current with a constant current intensity and a first flow direction, a negative current source that delivers a current with constant current intensity and a second flow direction opposite to the first flow direction, a ground terminal, a control device, a first switch device and a second switch device;

said first switch device having first and second switch positions, in the first switch position the positive current source being connected to the inverting input of the differential amplifier and in the second switch position the negative current source being connected to the inverting input of the differential amplifier;

the non-inverting input of said differential amplifier being connected to the ground terminal;

said second switch device being configured such that in a first switch position a first terminal of the first capacitor is connected to the inverting input of the differential amplifier and a first terminal of the second capacitor is connected to the non-inverting input of the differential amplifier, and such that in a second switch position the first terminal of the first capacitor is connected to the non-inverting input of the differential amplifier and the first terminal of the second capacitor is connected to the inverting input of the differential amplifier;

second terminals of said first and second capacitors being connected to the output of said differential amplifier and to an input of said control device;

synchronously switching said first switch device and said second switch device via said control device;

providing a device for determining a time between two switching events and the voltage occurring at the first and second capacitors, for adding said times and for determining values required for defining a difference in capacitance between the first and second capacitances;

a) permanently setting a quotient of current intensities of a current delivered by the positive current source and of a current delivered by the negative current source;

b) placing the first switch device in a first switch position; and setting the second switch device such that one capacitor is connected to one input of the differential amplifier and the other capacitor is connected to the other input of the differential amplifier, and respectively charging or discharging the capacitor connected to the first switch device during a predetermined time period or during a time period identified by the control device from previous method steps, the differential amplifier charging the other capacitor to the same voltage;

c) synchronously switching the first and the second switch device, so that the terminals of the capacitors connected to one input of the differential amplifier are connected to the respectively other input of the differential amplifier;

d) implementing step b), e) repeatedly implementing steps c) and d) in succession, whereby times during which step b) or step d) has been implemented are separately added for each of the first and second switch positions between which switching was carried out in step c), and whereby step d) is repeatedly implemented until the voltage at the capacitors subsequently coincides with the voltage at the capacitors at the start to at least a degree as required for a predetermined measuring precision; and f) calculating the quotient of the capacitances or the quotient of the difference and the sum of the capacitances of the capacitors from one of known or separately identified quotients of the current magnitudes and the sums of the times added separately for the switch positions.

9. The method according to claim 8, wherein the first switch device is switched independently of the second switch device, and wherein the method for determining the quotient of the current magnitudes of the current delivered by the positive current source and of the current delivered by the negative current source, has the steps of:

aa) placing the first switch device into a first switch position and setting the second switch device such that at least one respective capacitor is connected to the first switch device;

bb) respectively charging or discharging said respective capacitor during a predetermined time or during a time identified by the control device from previous method steps;

cc) switching over only the first switch device;

dd) implementing step bb);

ee) repeatedly implementing steps cc) and dd) in succession, times during which step bb) or dd) has been implemented being added separately for each of the first and second switch positions of the first switch device and repeatedly implementing the step dd) until the voltage at the capacitor subsequently coincides with the voltage at the capacitor at the start to at least a degree required for a predetermined measuring precision; and ff) determining a quotient of the current magnitudes of the current delivered by the positive current source and the current delivered by the negative current source as quotient of a sum of the times separately added for a respective switch position wherein the capacitor is connected to the negative current source and a sum of the times separately added for a further respective switch position wherein the capacitor is connected to the positive voltage source.

10. A method for determining a difference of capacitances of first and second capacitors or a quotient of a difference and a sum of the capacitances of the first and second capacitors, comprising the steps of:

providing a differential amplifier having an inverting input and a non-inverting input and having an output, a positive current source that delivers a current with a constant current intensity and a first flow direction, a negative current source that delivers a current with constant current intensity and a second flow direction opposite to the first flow direction, a ground terminal, a control device, a first switch device and a second switch device;

said first switch device having first and second switch positions, in the first switch position the positive current source being connected to the inverting input of the differential amplifier and in the second switch position the negative current source being connected to the inverting input of the differential amplifier;

the non-inverting input of said differential amplifier connected to the ground terminal;

said second switch device being configured such that in a first switch position a first terminal of the first capacitor is connected to the inverting input of the differential amplifier and a first terminal of the second capacitor is connected to the non-inverting input of the differential amplifier, and such that in a second switch position the first terminal of the first capacitor is connected to the non-inverting input of the differential amplifier and the first terminal of the second capacitor is connected to the inverting input of the differential amplifier;

second terminals of said first and second capacitors being connected to the output of said differential amplifier and to an input of said control device;

synchronously switching said first switch device and said second switch device via said control device;

providing a device for determining a time between two switching events and the voltage occurring at the first and second capacitors, for adding said times and for determining values required for defining a difference in capacitance between the first and second capacitances;

the second switch device enabling a first switch position wherein the first terminals of the first and second capacitors connected to an input of the differential amplifier are both connected to the ground terminal;

the second switch device being switched, synchronously with the first switch device, between said first switch position and each of two switch positions wherein the first terminals of the capacitors, connected to an input of the differential amplifier, are connected to different inputs of the differential amplifier;

the control device having a further device for adding changes in the voltage at the capacitors respectively ensuing at least for one of these switch positions and for storing a sum that is a result of the adding;

a) permanently setting the quotient of the current intensities of a current delivered by the positive current source and a current delivered by the negative current source;

b) placing the first switch device in a first switch position and setting the second switch device to one of first and second switch positions wherein either one capacitor of the first and second capacitors is connected to one input of the differential amplifier and the other capacitor of the first and second capacitors is connected to the other input of the differential amplifier, or terminals of the first and second capacitors connected to an input of the differential amplifier are both connected to the ground terminal, respectively charging or discharging a further capacitor that is connected between the inverting input of the differential amplifier and the output of the differential amplifier and in parallel to the differential amplifier during a predetermined time or during a time identified by the control device from previous method steps, the differential amplifier charging the other capacitor or capacitors to the same voltage as the further capacitor, c) synchronously switching the first and the second switch device, so that the capacitors proceed from a set specific switch position into another set specific switch position;

d) implementing the step b);

e) repeatedly implementing steps c) and d) in succession, times during which step b) or step d) has been implemented being separately added for each of the first and second specific switch positions and changes in the voltage at the capacitors respectively occurring during these times being separately added at least for one of the first and second specific switch positions and repeatedly implementing step d) until the voltage at the capacitors subsequently coincides with the voltage at the capacitors at the start to at least a degree required for a predetermined measuring precision, and storing by the control device a sum of changes in the voltage at the capacitors that occur in the first and second specific switch positions;

f) setting the second switch device into one of second and third specific switch positions, whereby, in the third specific switch position one capacitor of the first and second capacitor is connected to one input of the differential amplifier and the other capacitor of the first and second capacitors is connected to the other input of the differential amplifier and the terminals are thereby transposed compared to the first specific switch position;

g) implementing step b);

h) implementing step c), whereby switching is carried out between the second and third specific switch positions;

i) implementing step b);

j) repeatedly implementing steps h) and i) in succession and separately adding times during which step g) or step i) has been implemented for the second and third specific switch positions and separately adding changes in the voltage at the capacitors respectively occurring during these times at least for one of the second and third specific switch positions, and either storing by the control device a sum of the changes in the voltage at the capacitors that occurred in a respective specific switch position is likewise stored by the control device or repeatedly implementing step i) in the respective specific switch position until an amount of this sum reaches an amount of the value stored by the control device in step e), and implementing step i) overall as often and respectively until the voltage at the capacitors subsequently coincides with the voltage at the capacitors at the start to at least a degree required for a predetermined measuring precision; and k) calculating a quotient of the difference and the sum of the capacitances of the capacitors from a known or separately identified quotients of the current magnitudes, the sums of the times separately added for the switch positions and the quotient of the sums of the changes in the voltage respectively acquired in steps e) and j) or the difference in the capacitances of the capacitors being determined from these values and a known or separately identified value of the capacitance of the further capacitor.

11. The method according to claim 10, wherein the first switch device is switched independently of the second switch device, and wherein the method for determining the quotient of the current magnitudes of the current delivered by the positive current source and of the current delivered by the negative current source, has the steps of:

aa) placing the first switch device into a first switch position and setting the second switch device such that at least one respective capacitor is connected to the first switch device;

bb) respectively charging or discharging said respective capacitor during a predetermined time or during a time identified by the control device from previous method steps;

cc) switching over only the first switch device;

dd) implementing step bb);

ee) repeatedly implementing steps cc) and dd) in succession, times during which step bb) or dd) has been implemented being added separately for each of the first and second switch positions of the first switch device and repeatedly implementing the step dd) until the voltage at the capacitor subsequently coincides with the voltage at the capacitor at the start to at least a degree required for a predetermined measuring precision; and ff) determining a quotient of the current magnitudes of the current delivered by the positive current source and the current delivered by the negative current source as quotient of a sum of the times separately added for a respective switch position wherein the capacitor is connected to the negative current source and a sum of the times separately added for a further respective switch position wherein the capacitor is connected to the positive voltage source.

* * * * *